United States Patent [19]

Park

[11] Patent Number: 5,631,199

[45] Date of Patent: May 20, 1997

[54] FURNACE FOR MANUFACTURING A SEMICONDUCTOR DEVICE, AND A METHOD OF FORMING A GATE OXIDE FILM BY UTILIZING THE SAME

[75] Inventor: Mi Ra Park, Kyungki-Do, Rep. of Korea

[73] Assignee: Hyundai Electronics Industries Co., Ltd., Kyungki-Do, Rep. of Korea

[21] Appl. No.: 499,241

[22] Filed: Jul. 7, 1995

[30] Foreign Application Priority Data

Jul. 7, 1994 [KR] Rep. of Korea ............... 1994/16248

[51] Int. Cl.$^6$ .................................. H01L 21/318
[52] U.S. Cl. ........................ 438/770; 438/935; 438/909
[58] Field of Search ............................. 437/239, 238, 437/235, 247, 40 GS, 41 GS

[56] References Cited

U.S. PATENT DOCUMENTS

| | | | |
|---|---|---|---|
| 5,057,463 | 10/1991 | Bryant et al. | 437/239 |
| 5,132,244 | 7/1992 | Roy | 437/239 |
| 5,187,113 | 2/1993 | Tyson et al. | 437/42 |
| 5,210,056 | 3/1993 | Pong et al. | 437/239 |
| 5,227,340 | 7/1993 | Pintchovski et al. | 437/235 |
| 5,244,843 | 9/1993 | Chau et al. | |
| 5,360,769 | 11/1994 | Thakur et al. | 437/239 |
| 5,393,683 | 2/1995 | Mathews et al. | 437/42 |
| 5,397,720 | 3/1995 | Kwong et al. | 437/235 |
| 5,541,141 | 7/1996 | Cho | 437/239 |

FOREIGN PATENT DOCUMENTS 6-104252  4/1994  Japan .

*Primary Examiner*—John Niebling
*Assistant Examiner*—S. Mulpuri
*Attorney, Agent, or Firm*—Fish & Richardson, P.C.

[57] ABSTRACT

A furnace for manufacturing a semiconductor device and a method of forming a gate oxide film by utilizing the same is disclosed, which can decrease the budget of the device and improve the quality of the oxide film. First $N_2O$ gas in a source furnace maintained at a high temperature. This eliminates factors contributing to poor quality. These factors include the increase of $H_2$ generated as a result of the difference in the resolving temperatures of $N_2O$ and $NH_3$ in the oxidization process. Also, the invention results in the oxidizing a selected portion of a wafer by making $N_2O$ and $NH_3$ react in the main furnace maintained at low temperature.

3 Claims, 3 Drawing Sheets

FURNACE FOR MANUFACTURING A SEMICONDUCTOR DEVICE, AND A METHOD OF FORMING A GATE OXIDE FILM BY UTILIZING THE SAME

BACKGROUND OF INVENTION

1. Field of the invention

The present invention relates to a furnace for manufacturing a semiconductor device and a method of forming a gate oxide film by utilizing the same, and particularly, to a furnace for manufacturing a semiconductor device and a method of forming a gate oxide film by utilizing the same which can produce an oxide film of improved characteristics and reduce the required thermal budget by first resolving $N_2O$ in a source furnace maintained at a high temperature and then oxidizing a selected portion of the wafer by making a $N_2O$ gas and $NH_3$ gas react in a main furnace maintained at a low temperature.

2. Information Disclosure Statement

As the degree of integration is increased, the thickness of the gate oxide film which generally forms a MOS device is decreased. A prior art furnace for manufacturing a semiconductor device and a method for forming a gate oxide film by utilizing the same are explained below with reference to FIG. 1 and FIG. 2.

The prior art furnace for manufacturing a semiconductor device is constructed in such a way that wafers 5 loaded in a boat 4 are placed in a furnace 1 provided with a gas inlet 2 and an outlet 3 as shown in FIG. 1. In the method of forming the gate oxide film of the semiconductor device utilizing the furnace 1, the wafer 5 is loaded into the furnace 1 at the temperature of 650° C., and the lamp up process proceeds in such manner that the temperature of the furnace 1 is raised to 700° C. through 900° C. as shown in FIG. 2. Then, the furnace 1 is stabilized under an $N_2$ gas environment. The gate oxide film is then formed on the wafer 5 by the oxidization process resulting from reaction of $N_2O$ and $NH_3$ gases injected through the gas inlet 2. A heat treatment process is then conducted under $N_2$ gas environment. Then, a ramp down process lowers the temperature of the furnace 1 to 800° C. The wafers 5 are then unloaded.

The resolution temperature of $N_2O$ gas is above 900° C., and that of $NH_3$ gas is 600° C. through 700° C., so that the resolution of $N_2O$ gas is small in the oxidization process. On the other hand, the resolution of $NH_3$ gas is excessive, thereby reducing the amount of $NH_3$ gas. If the temperature of the furnace 1 is lowered in the oxidization process to improve the quality of the gate oxide film, the resolution of $NH_3$ gas is even greater so that the amount of $H_2$ is increased, creating the danger of explosion, and degrading the quality of the gate oxide film.

SUMMARY OF THE INVENTION

Therefore, it is an object of the present invention to provide a furnace for manufacturing a semiconductor device and a method of forming a gate oxide film by utilizing the same which can solve the above described disadvantages by first resolving $N_2O$ gas in the source furnace maintained at a high temperature and by oxidizing a selected portion of the wafer by making the $N_2O$ gas and $NH_3$ gas react in the main furnace maintained at low temperature.

To accomplish the above described object, a method of forming a gate oxide film of the present invention comprising the steps of:

loading wafers into a main furnace of constant temperature, and injecting a $N_2O$ gas into a source furnace of constant temperature through a second gas inlet; raising the temperatures of the main furnace and source furnace by performing a ramp up process for each furnace; stabilizing the inside of the main furnace under $N_2$ gas environment and conducting a preoxidization process when the $N_2O$ gas, resolved in the source furnace, flows into the main furnace through a connection pipe; conducting a main oxidization process under an environment of the resolved $N_2O$ gas and $NH_3$ gas which is injected through a first gas inlet; conducting a purge process under the environment of the resolved $N_2O$ gas; and heat treating the wafer under $N_2$ gas environment, and thereafter, performing a ramp down process to lower the temperature of the main furnace, and unloading the wafers.

BRIEF DESCRIPTION OF THE DRAWINGS

For a fuller understanding of the nature and object of the invention, reference should be made to the following detailed description taken in conjunction with the accompanying drawings in which.

Similar reference characters refer to similar parts through the several views of the drawings.

DETAILED DESCRIPTION OF THE INVENTION

Figure 1:
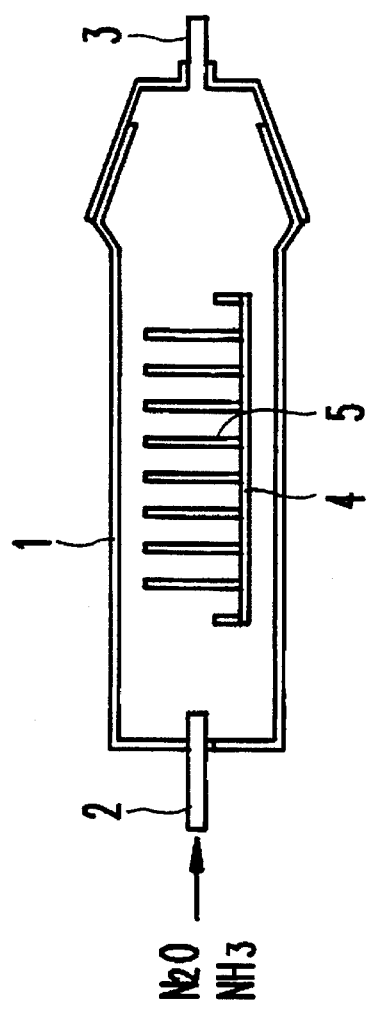
FIG. 1 is a schematic view of a prior art furnace for manufacturing a semiconductor device.

FIG. 1 is a schematic view of a prior art furnace for manufacturing a semiconductor device and is discussed above.

Figure 3:
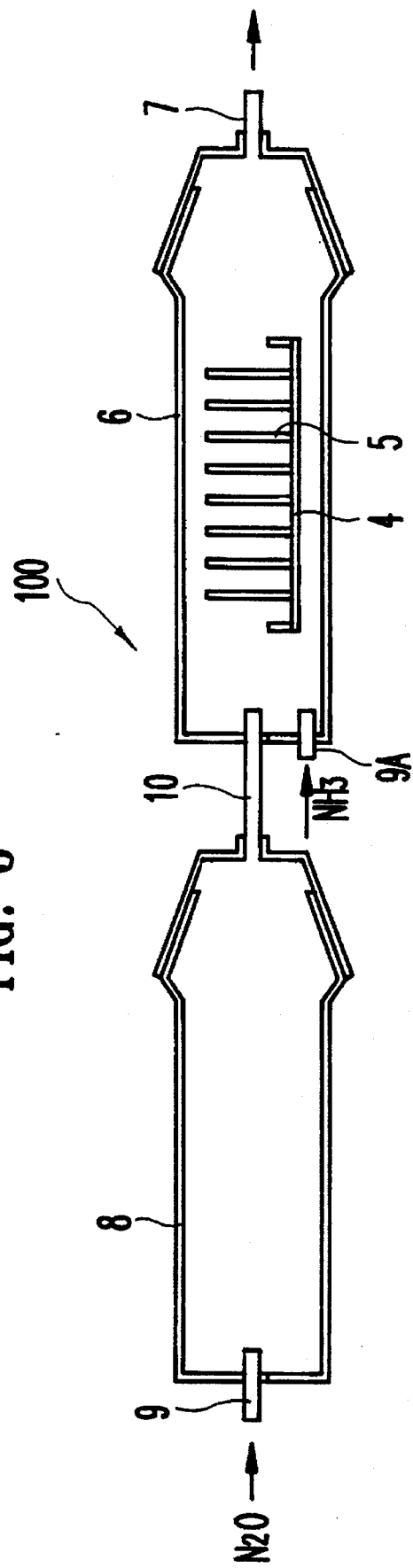
FIG. 3 is a schematic view of a furnace for manufacturing a semiconductor device of the present invention.
Figure 2:
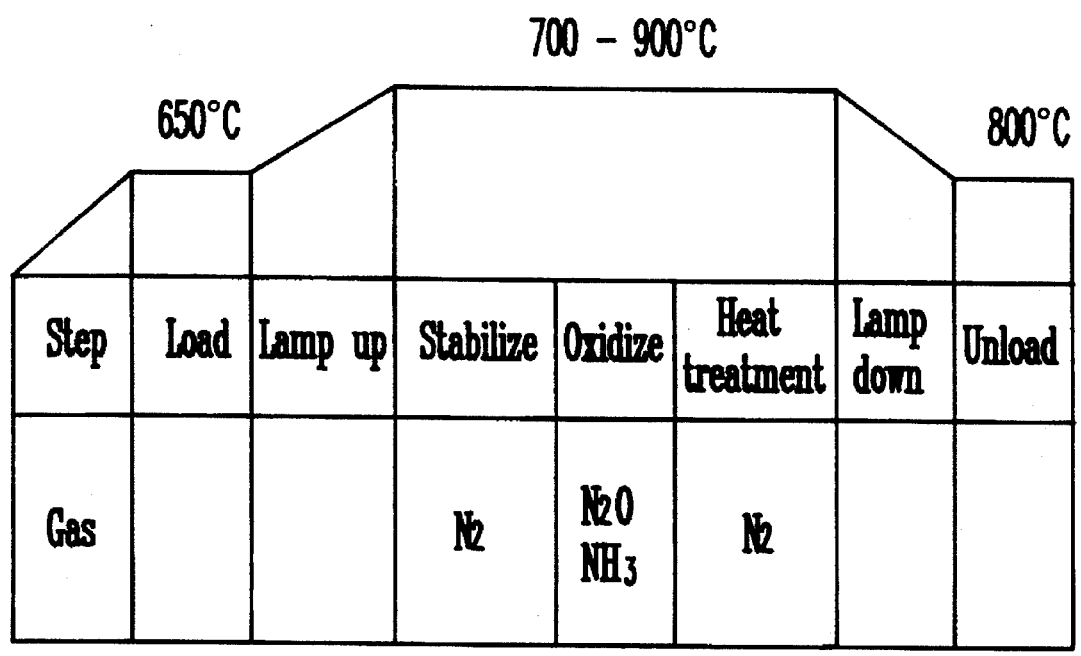
FIG. 2 is a flow chart to explain an oxidation recipe utilizing a prior art furnace of FIG. 1.

FIG. 3 is a schematic view of a furnace for manufacturing a semiconductor device of the present invention. A furnace 100 of the present invention consists of a main furnace 6 which is provided with an outlet 7 and a first gas inlet 9A and in which a boat 4 loaded with wafers 5 can be placed, and a source furnace 8 which is provided with a second gas inlet 9 and which is connected to the main furnace 6 through a connection pipe 10. The method of forming a gate oxide film by utilizing the furnace 100 is explained with reference to FIG. 4 and FIG. 5.

Figure 5:
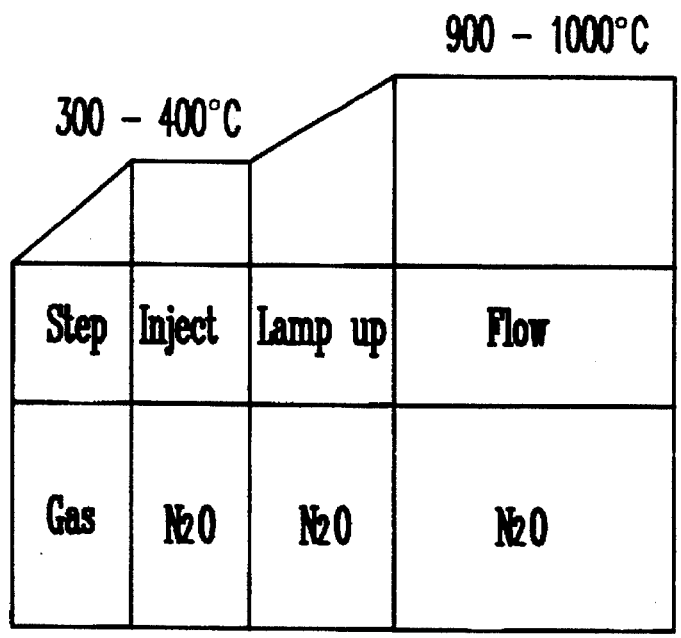
FIGS. 4 and 5 are flow charts to explain an oxidation recipe utilizing a furnace of FIG. 3.
Figure 4:
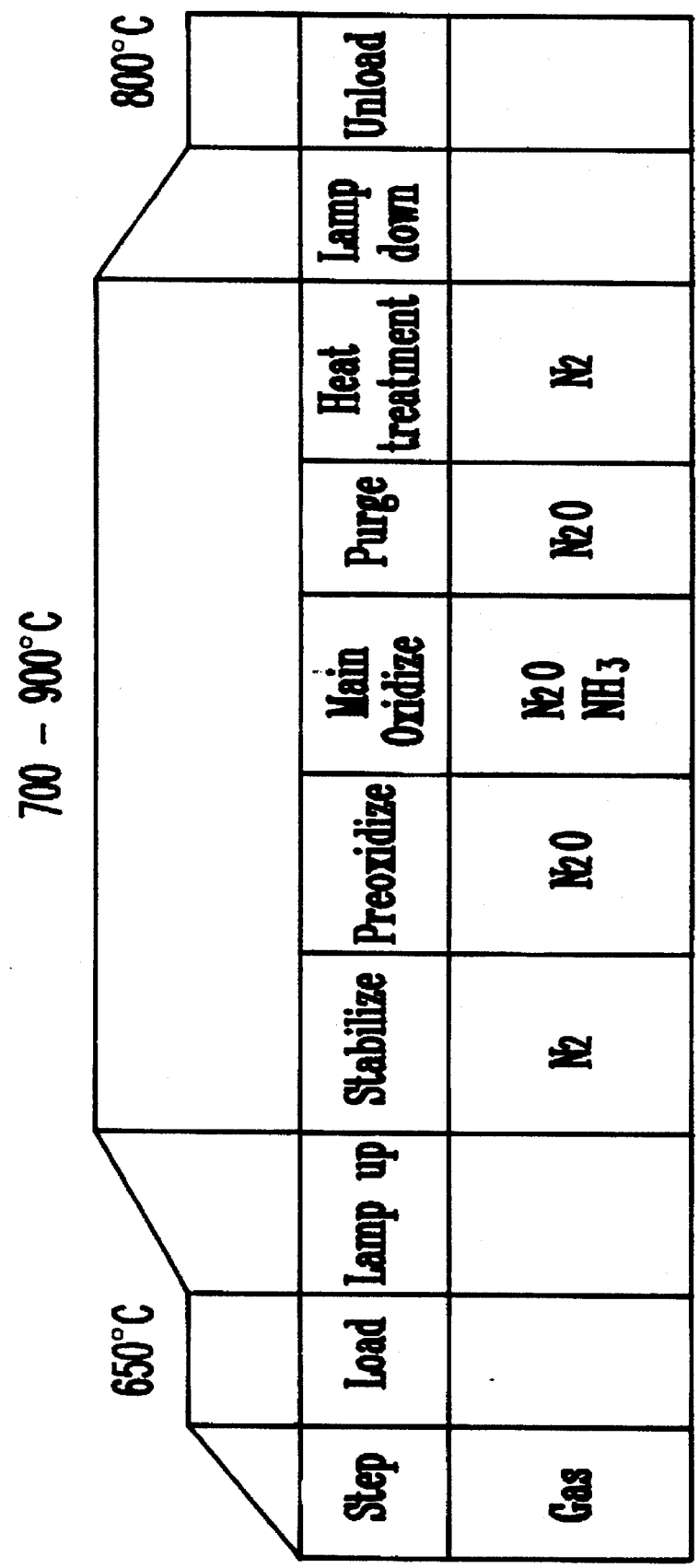

In the method of forming a gate oxide film by utilizing the above described furnace, as shown in FIG. 4, the wafer 5 is loaded into the main furnace 6 at the temperature of 650° C., and the ramp up process is conducted so that the temperature of the main furnace 6 is raised to 700° C. through 900° C. At this time, as shown in FIG. 5, the source furnace 8, into which $NO_2$ gas is injected through the second gas inlet 9, is also raised from a temperature of 300° C. through 400° C. to a temperature of 900° C. through 1000° C. by the ramp up process.

Thereafter, the main furnace 6 is stabilized under $N_2$ gas environment. The surface of the wafer 5 is then preoxidized under the condition that $N_2O$ gas, resolved in the source furnace 8, flows into the main furnace 6 through the connection pipe 10. If the $NH_3$ gas is supplied from the first gas inlet 9A, the main oxidization process will proceed due to the $NH_3$ gas and the resolved $N_2O$ gas. Thereafter, the inside of the main furnace 6 is purged under $N_2O$ gas environment and the wafer is heat treated under $N_2$ gas environment to form the gate oxide film. The ramp down process is performed to lower the temperature of the main furnace 6, and thereafter the wafers 5 are unloaded. The flow ratio of $N_2O$ gas supplied from the source furnace 8 is adjusted to 2% through 10%. The preoxidization and purge processes are performed to prevent the $H_2$ gas from being in excess among $NH_3$ gas.

As described above, according to the present invention, the thermal budget of the semiconductor device can be reduced by the supply of the $N_2O$ gas which is sufficiently resolved in the source furnace maintained at high temperature. In addition, the risk of explosion due to $H_2$ generated at the time of resolution of the $NH_3$ gas is minimized. Also, the gate oxide film can be grown at the low temperature, so that there is an excellent effect in that a thin oxide film of preferred flatness which is required in the high integration device can be formed.

Although this invention has been described in its preferred embodiment with a certain degree of particularity, one skilled in the art would know that the preferred embodiment disclosed here is only an example and that the construction, combination and arrangement of its parts may be varied without departing from the spirit and the scope of the invention.

What is claimed is:

1. A method of manufacturing a semiconductor device by utilizing a furnace to form a gate oxide film, comprising the steps of:

loading wafers into a main furnace of constant temperature, and injecting a $N_2O$ gas into a source furnace of constant temperature through a second gas inlet;

raising the temperatures of said main furnace in a ramp-up process and resolving the $N_2O$ in said source furnace by raising the temperature of the source furnace in a ramp-up process;

stabilizing the inside of said main furnace under $N_2$ gas environment;

allowing the resolved $N_2O$ gas in said source furnace to flow into said main furnace through a connection pipe;

conducting a preoxidization process in said main furnace;

injecting $NH_3$ gas into said main furnace through a first gas inlet;

conducting a main oxidization process in said main furnace under an environment of said resolved $N_2O$ gas and said injected $NH_3$ gas;

conducting a purge process in said main furnace under the environment of said resolved $N_2O$ gas;

heat treating the wafer under an $N_2$ gas environment;

performing a ramp down process to lower the temperature of said main furnace; and unloading said wafers.

2. The method as claimed in claim 1, wherein after performing said ramp up process, said temperature of said source furnace is maintained at 900° C. through 1000° C., and said temperature of said main furnace is maintained at 700° C. through 900° C.

3. A method of forming agate oxide film by utilizing a furnace for manufacturing a semiconductor device, comprising the steps of:

loading wafers into a main furnace of constant temperature, and injecting a $N_2O$ gas into a source furnace of constant temperature through second gas inlet;

raising the temperatures of said main furnace and source furnace by performing a ramp up process for each furnace;

stabilizing the inside of said main furnace under $N_2$ gas environment, and conducting a preoxidization process after the $N_2O$ gas resolved in said source furnace flows into said main furnace through a connection pipe;

conducting a main oxidization process under an environment of said resolved $N_2O$ gas and $NH_3$ gas injected through a first gas inlet;

conducting a purge process under the environment of said resolved $N_2O$ gas; and heat treating the wafer under $N_2$ gas environment, and thereafter, performing a ramp down process to lower the temperature of said main furnace, and unloading said wafers, wherein the ratio of the $N_2O$ gas flow supplied from said source furnace in the main oxidation process is 2% through 10%.

* * * * *